United States Patent [19]

Koyama et al.

[11] Patent Number: 5,200,808
[45] Date of Patent: Apr. 6, 1993

[54] SEMICONDUCTOR DEVICE HAVING SMOOTH CONTACT HOLES FORMED THROUGH MULTI-LAYER INSULATORS OF DIFFERENT ETCHING SPEEDS

[75] Inventors: Toru Koyama; Katuhiko Tamura; Takako Nagamine, all of Hyogo, Japan

[73] Assignee: Mitsubishi Denki Kabushiki Kaisha, Tokyo, Japan

[21] Appl. No.: 914,219

[22] Filed: Jul. 16, 1992

Related U.S. Application Data

[63] Continuation of Ser. No. 578,923, Sep. 7, 1990, abandoned.

[30] Foreign Application Priority Data

Nov. 29, 1989 [JP] Japan .................. 1-311269

[51] Int. Cl.⁵ .................. H01L 23/48; H01L 29/34
[52] U.S. Cl. .................. 250/750; 257/758; 257/760
[58] Field of Search .................. 357/49, 68, 71, 54

[56] References Cited

U.S. PATENT DOCUMENTS

| | | | |
|---|---|---|---|
| 4,489,481 | 12/1984 | Jones | 357/68 |
| 4,970,175 | 11/1990 | Haisma et al. | 357/49 |
| 4,984,055 | 1/1991 | Okumura et al. | 357/49 |

FOREIGN PATENT DOCUMENTS 64-57717  3/1989  Japan .

OTHER PUBLICATIONS

*McGraw-Hill Encyclopedia of Science and Technology,* vol. 2, pp. 473–474, McGraw-Hill, Inc., 1971.
Sze, "Appendix 1," *Physics of Semiconductor Devices,* Second Edition, p. 852, John Wiley & Sons, Inc., New York, 1981.
D. K. Seto et al., "Monolithic Circuit Interconnects", IBM Technical Disclosure Bulletin, vol. 9, No. 7, Dec. 1966, pp. 922–3.
"Substrate Contact Through a Trench," IBM Technical Disclosure Bulletin, vol. 28, No. 7, Dec. 1985, pp. 3012–15.
"Magnesium Oxide Emitter Sidewall Etching Stop-Layer", IBM Technical Disclosure Bulletin, vol. 27, No. 12, May 1985, pp. 7159–60.

*Primary Examiner*—Mark V. Prenty
*Attorney, Agent, or Firm*—Lowe, Price, Leblanc & Becker

[57] ABSTRACT

Disclosed is a method of manufacturing a semiconductor device of a multi-layer film structure. A gate electrode having a connection portion is formed on a semiconductor substrate. An underlying silicon oxide film is formed on the semiconductor substrate including the gate electrode. A silicon nitride film is formed on the silicon oxide film. A first opening portion having a larger diameter than that of the connection portion is formed at a portion of the silicon nitride film above the connection portion. An overlying silicon oxide film is formed on the silicon nitride film so as to fill the first opening portion. A second opening portion for exposing the connection portion is formed in the underlying silicon oxide film and in the overlying silicon oxide film. A native oxide film existing on the surface of the exposed connection portion is removed with an aqueous solution of HF. Finally, an aluminum alloy film is deposited to fill the second opening portion and cover the overlying silicon oxide film. According to this method, when the native oxide film is etched away employing the HF aqueous solution, a sidewall of the contact hole recedes more or less, but no eaves-like protrusion of the silicon nitride film is produced on the sidewall of the contact hole. Consequently, the aluminum alloy film is satisfactorily connected to the gate electrode.

4 Claims, 8 Drawing Sheets

SEMICONDUCTOR DEVICE HAVING SMOOTH CONTACT HOLES FORMED THROUGH MULTI-LAYER INSULATORS OF DIFFERENT ETCHING SPEEDS

This application is a continuation of application Ser. No. 07/578,923 filed Sep. 7, 1990 and now abandoned.

BACKGROUND OF THE INVENTION

1. Field of the Invention

The present invention relates generally to semiconductor devices having multi-layer film structures, and more particularly to an improved semiconductor device of a multi-layer film structure in which a lower conductor layer and a upper conductor layer separated from each other by a multilayered insulator film from each other are electrically connected to each other in a satisfactory state through a contact hole provided in the multilayered insulator film. This invention further relates to a method of manufacturing such a semiconductor device having a multi-layer film structure.

2. Description of the Background Art

In recent years, there have been remarkable developments on higher integration of semiconductor devices. For this higher integration, such a technique is required as to form a contact hole in a multi-layer film.

Figure 4A:
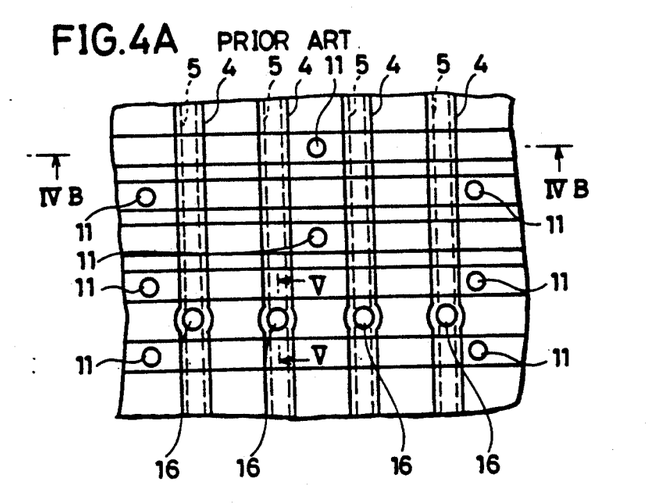
FIG. 4A is a plan view of a conventional dynamic random access memory having a multi-layer film structure.
Figure 4B:
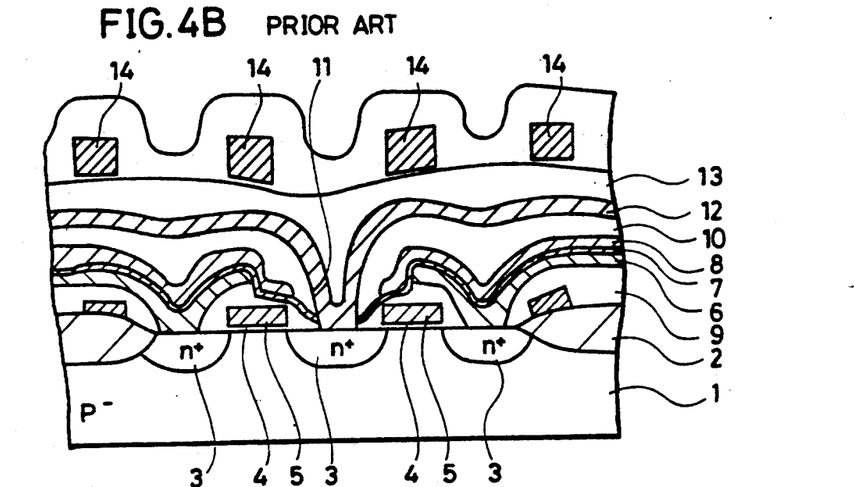
FIG. 4B is a cross sectional view taken along the lines IVB—IVB of FIG. 4A.

FIG. 4A is a plan view of a conventional Dynamic Random Access Memory (DRAM) having a multi-layer film. FIG. 4B is a cross sectional view-taken along the lines IVB—IVB of FIG. 4A. The DRAM includes a P type semiconductor substrate 1. In a major surface of the semiconductor substrate 1 is formed an isolation oxide film 2 for isolating elementary device regions. The DRAM shown in the figure basically includes a transistor and a stacked capacitor. The transistor includes an n type source/drain region 3 formed in the major surface of the semiconductor substrate 1, a transfer gate oxide film 4 provided on the semiconductor substrate 1, and a transfer gate 5. The stacked capacitor includes a storage node 6, a capacitor dielectric film 7 provided on the storage node 6, and a cell plate electrode 8 provided on the capacitor dielectric film 7. The storage node 6 and the transfer gate 5 are isolated from each other by a first interlayer insulation film 9 provided therebetween. The first interlayer insulation film 9 is formed such as of a silicon oxide film, while the capacitor dielectric film 7 is formed such as of a silicon nitride film.

A second interlayer insulation film 10 is provided on the overall surface of the semiconductor substrate 1 including the transistor and stacked capacitor. A contact hole 11 reaching the source/drain region 3 is provided in the second interlayer insulation film 10. A bit line 12 is connected to the source/drain region 3 through the contact hole 11. On the bit line 12 is provided a third interlayer insulation film 13. On the third interlayer insulation film 13 is formed an Al interconnection 14 for carrying a signal to the transfer gate 5. The Al interconnection 14 is formed of an Al-Si-Cu alloy by sputtering.

Reading/writing operations of the DRAM structured as above are carried out by selecting a word line to apply a predetermined potential to the transfer gate 5 and thus render conductive a region between the source/drain regions 3, 3.

A description will now be given on a structure of a contact portion of the Al interconnection 14 and the transfer gate 5.

Figure 5:
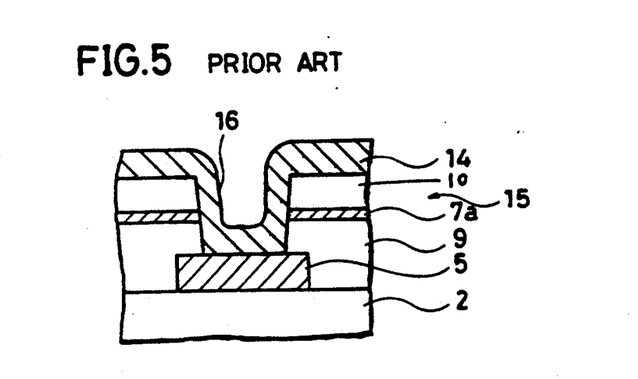
FIG. 5 is a cross sectional view of a conventional structure of a contact portion between Al interconnection and a transfer gate, taken along the lines V—V of FIG. 4A.

FIG. 5 is a cross sectional view of a conventional structure of the contact portion between the Al interconnection and the transfer gate, taken along the lines V—V of FIG. 4A.

Referring to FIG. 5, on the transfer gate 5 is formed a multi-layer film 15 including the first interlayer insulation film 9, an extended portion 7a of the capacitor dielectric film 7 and the second interlayer insulation film 10. A contact hole 16, through which the Al interconnection 14 is connected to the transfer gate 5, is formed in the multi-layer film 15. This Al interconnection 14 is formed by sputtering as described above.

Referring to FIG. 4A, when the bit line 12 is connected to the source/drain region 3 through the contact hole 11, polysilicon is filled in the contact hole 11 by a CVD method. No problem occurs in this case since the CVD method provides a good covering property to a sidewall surface of the contact hole 11.

Referring to FIG. 5, however, when the Al interconnection 14 is connected to the transfer gate 5 through the contact hole 16, the Al-Si-Cu alloy is filled in the contact hole 16 by sputtering. Since this sputtering method provides a poor covering property to the sidewall surface of the contact hole 16, it does not provide such an ideal structure as shown in FIG. 5. This method has the following problems which will now be described with reference to the following figures.

FIGS. 6A-6D are cross sectional views showing conventional steps of forming a contact hole in a multi-layer film.

Figure 6A:
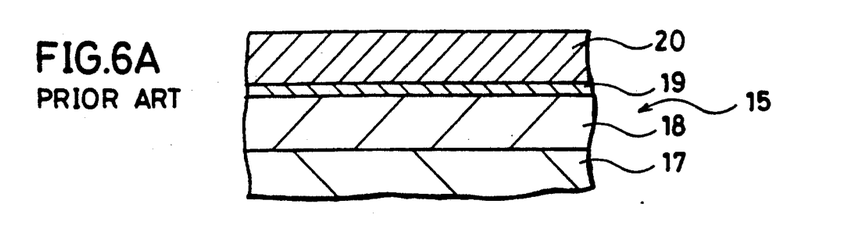
FIGS. 6A-6D are cross sectional views showing in turn the processing steps of a conventional method of forming a contact hole in a conventional semiconductor device having a multi-layer film structure.

Referring to FIG. 6A, a multi-layer film 15 is formed on a substrate 17. The multi-layer film 15 includes an underlying film 18, an intermediate film 19 and an overlying film 20. The substrate 17 is, for example, a silicon substrate or an interconnection (polycrystalline silicon, an Al alloy and so on). The underlying film 18 is an interlayer insulation film such as a silicon oxide film. The intermediate film 19 is an extended portion of a capacitor dielectric film such as a silicon nitride film. The overlying film 20 is an interlayer insulation film such as a silicon oxide film.

Figure 6B:
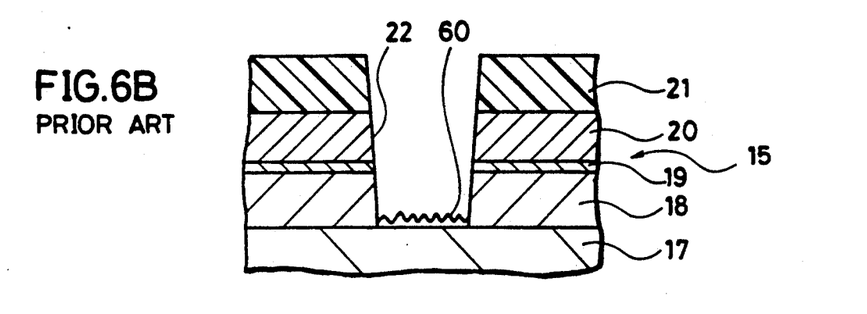

Referring to FIG. 6B, a resist film 21 is then formed on the multi-layer film 15. Thereafter, the resist film 21 is patterned so that an opening portion can be formed in a portion where a contact hole is to be formed. With the resist film 21 used as a mask, the multi-layer film 15 including the underlying film 18, the intermediate film 19 and the overlying film 20 is then etched so as to expose the surface of the substrate 17, thereby forming a contact hole 22. The contact hole 22 is formed, in general, by etching all of the overlying film 20, the intermediate film 19 and the underlying film 18 at a time, employing highly anisotropical plasma etching. An increase in anisotropy decreases a selectivity of etching the silicon oxide films (18, 20) and the silicon nitride film (19), resulting in a smooth etching surface. At this stage, a native oxide film 60 is produced at the bottom surface of the contact hole 22. Thereafter, the resist film 21 is removed.

Figure 6C:
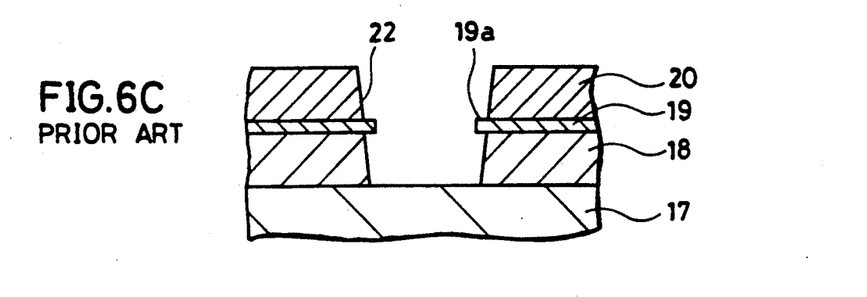
Figure 6D:
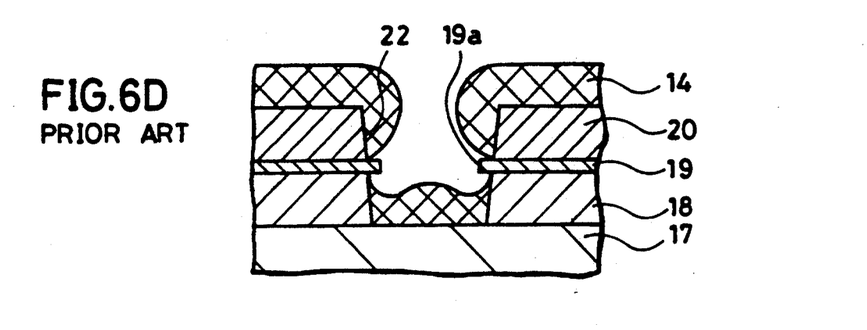

Referring to FIG. 6C, after the removal of the resist film 21, the substrate 17 is dipped into a dilute aqueous solution of hydrofluoric acid or of ammonium fluoride for a short time, so as to remove a very thin native oxide film of approximately scores angstrom existing on the surface of the substrate 17. The processing of removing this native oxide film is an indispensable step for enhancing an ohmic contact of the substrate 17 with an Al interconnection which will be formed later. However, since a processing of removing the native oxide film by a wet method is a chemical etching, it provides an increased selectivity of etching. Thus, the silicon oxide films (18, 20) are etched, while the silicon nitride film (19) is not etched, whereby an eaves-like protrusion 19a of the silicon nitride film 19 is produced at the sidewall surface of the contact hole 22, as shown in the figure. If an Al interconnection 14 such as of an Al alloy is formed by sputtering, leaving the protrusion 19a, the Al interconnection 14 does not extend beneath the protrusion 19a, with reference to FIG. 6D. Consequently, the covering property of the Al interconnection 14 is extremely deteriorated at the sidewall surface of the contact hole 22, or in an extreme case, as shown in the figure, the Al interconnection 14 is disconnected to be poorly conductive through the intermediate film 19 (silicon nitride film). Further, even in no such an extreme case of disconnection, a film thickness of the Al interconnection 14 becomes decreased at the protrusion 19a, resulting in a decrease in reliability.

Moreover, the conventional method sometimes presents problems also in the formation of the contact hole.

FIGS. 7A-7E are processing steps showing a method of forming a contact hole in a multi-layer film, employing both wet etching and anisotropical etching.

Figure 7A:
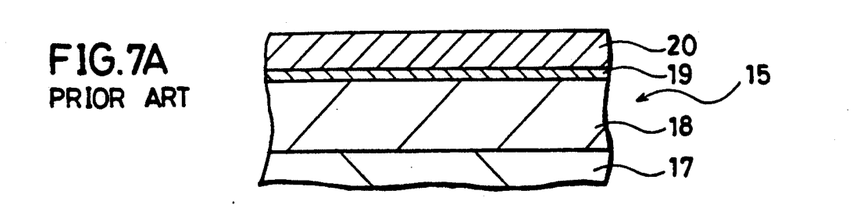
FIGS. 7A-7E are cross sectional views showing another conventional example of the processing steps of forming a contact hole in a semiconductor device of a multi-layer film structure.

Referring to FIG. 7A, a multi-layer film 15 is formed on a substrate 17. The multi-layer film 15 includes an underlying film 18, an intermediate film 19 and an overlying film 20. The underlying film 18 and overlying film 20 are, for example, silicon oxide films. The intermediate film 19 is a silicon nitride film.

Figure 7B:
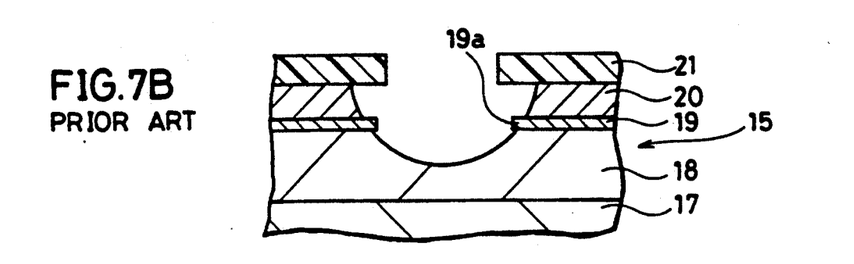
Figure 7C:
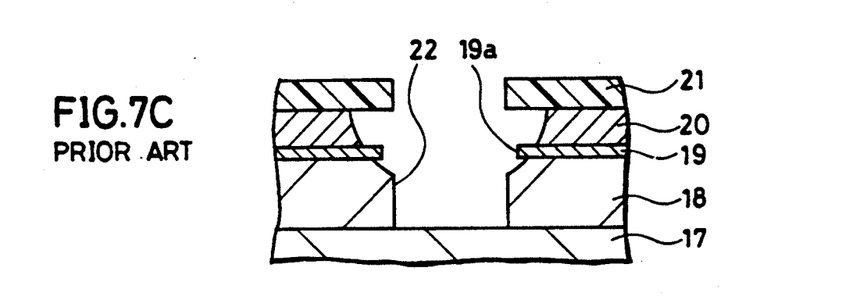

Referring to FIG. 7B, a resist film 21 is then formed on the multi-layer film 15. The resist film 21 is patterned so that an opening portion can be formed in a portion where a contact hole is to be formed. Thereafter, with the resist film 21 used as a mask, the multi-layer film 15 is subjected to isotropical wet etching with an etchant of the hydrogen fluoride system. The wet etching is employed together in the formation of the contact hole in order to taper upper end portions of the contact hole. This wet etching is, however, a chemical etching, so that it provides an increased selectivity of etching. Therefore, the silicon oxide films (18, 20) are etched, while the silicon nitride film (19) is not etched, whereby an eaves-like protrusion 19a of the silicon nitride film 19 is produced as shown in the figure. Next, referring to FIG. 7C, with the resist film 21 employed as a mask, a contact hole 22 extending to the substrate 17 is formed by anisotropical plasma etching.

Figure 7D:
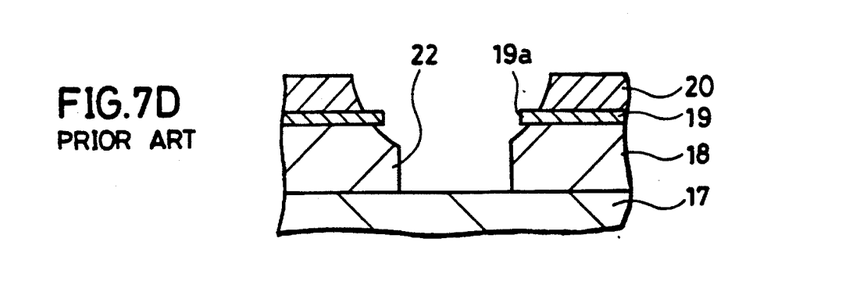

Thereafter, referring to FIG. 7D, removal of the resist film 21 results in such a contact hole 22 in which the protrusion 19a of the silicon nitride film 19 is projecting from the sidewall surface of the contact hole 22.

Figure 7E:
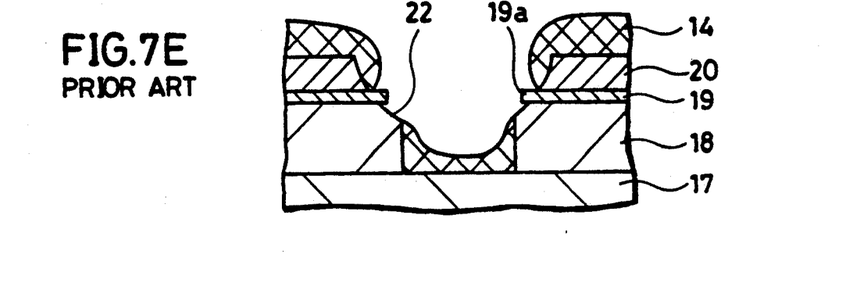

If the Al interconnection 14 such as of an Al alloy is formed by sputtering, leaving the eaves-like protrusion 19a, the Al interconnection 14 does not extend beneath the protrusion 19a, as shown in the figure. Consequently, the covering property of the Al interconnection 14 is extremely deteriorated at the sidewall surface of the contact hole 22, or in an extreme case, as shown in the figure, the Al interconnection 14 is disconnected to be poorly conductive through the silicon nitride film 19. Further, even in no such an extreme case of disconnection, a film thickness of the Al interconnection 14 is decreased at portion where the protrusion 19a is formed, resulting in a decrease in reliability.

Figure 8:
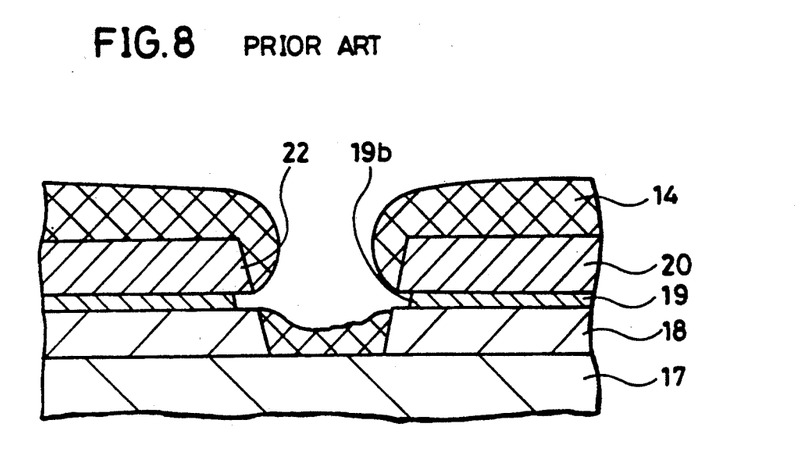
FIG. 8 is a cross sectional view showing problems in case of forming a contact hole in a semiconductor device of a multi-layer film structure having an SOG film.

The above described embodiment provides by way of example the case that the intermediated film projects as the eaves-like protrusion from the sidewall surface of the contact hole. Meanwhile, referring to FIG. 8, when a spin-on-glass film (SOG film) having low density is employed for the intermediate film 19, an etching before formation of the Al interconnection (an etching for removing the native oxide film) causes the intermediate film 19 to recede from the sidewall surface of the contact hole 22, so as to produce a hollowed groove 19b at the sidewall surface of the contact hole 22. If the Al interconnection 14 is formed by sputtering, leaving the hollowed groove 19b, the Al interconnection 14 is disconnected as shown in the figure. Since members or elements denoted with like reference numerals 14, 17, 18, 20 and 22 in FIG. 8 are totally identical to those described in FIG. 6D, descriptions thereof will not be repeated here.

The disconnection of the Al interconnection in the contact hole, mentioned above, will increasingly become a serious problem in the future because the film structure becomes further multilayered as miniaturization of the semiconductor device is proceeded. Moreover, the covering property of metal interconnection film is more deteriorated as an aspect ratio of the contact hole becomes increased and so on.

To solve the foregoing problems, Japanese Patent Laying-Open No. 64-57717 discloses a technique of protecting the sidewall surface of the contact hole by employing a polycrystalline silicon film.

Figure 9:
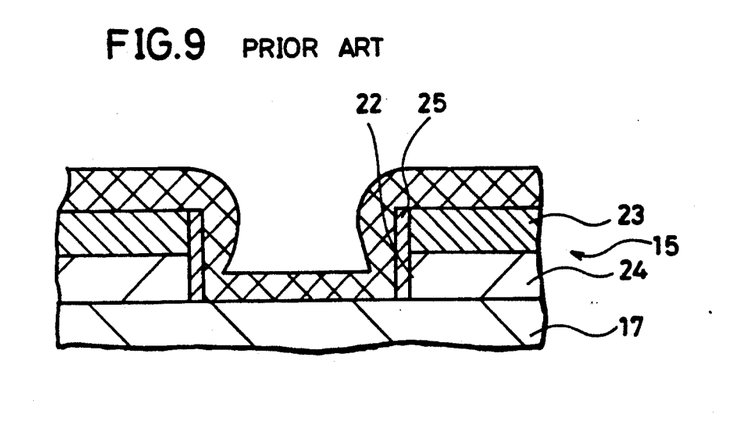
FIG. 9 is a cross sectional view of a conventional semiconductor device of a multi-layer film structure in which sidewalls of the contact hole are protected by a polycrystalline silicon film.

That is, referring to FIG. 9, a multi-layer film 15 is formed on a substrate 17. The multi-layer film 15 includes an overlying film 23 and an underlying film 24. In the multi-layer film 15 is formed a contact hole 22 extending to the substrate 17. A polysilicon film 25 is formed to cover a sidewall surface of the contact hole 22. This structure prevents an occurrence of the foregoing eaves-like protrusion and hollowed groove. This method, however, involves the following problems.

That is, when the contact hole 22 is formed by etching the multi-layer film 15, the surface of the substrate 17 receives an impact energy during RIE plasma etching. Furthermore, the surface of the substrate 17 again receives an impact energy during etching because polysilicon 25 is formed on the sidewall surface of the contact hole 22. Since the surface of the substrate 17 receives double impact energy, there occurs a problem that the substrate 17 is damaged so as to generate a leakage current.

Another problem also arises that a polycrystalline silicon film remains as a residue at the bottom of the contact hole 22 during etching of the polycrystalline silicon, so that the Al interconnection 14 can not make ohmic contact with the substrate 17.

Moreover, according to this method, the polycrystalline silicon film is deposited on the substrate 17 by the CVD method and then subjected to dry etching so as to form a polysilicon film 25 at the sidewall surface of the contact hole 22. A further problem arises that flakes of polysilicon are dispersed as foreign matters during this dry etching and adhered everywhere in the semiconductor device, causing shorts between interconnections.

SUMMARY OF THE INVENTION

An object of the present invention is therefore to improve a semiconductor device having a multi-layer film structure, in which a lower conductor layer and an upper conductor layer separated by a multilayered insulator film are connected to each other through a contact hole provided in the multilayered insulator film so that the lower conductor layer and upper conductor layer are satisfactorily connected to each other.

Another object of the present invention is to improve a dynamic random access memory having a multi-layer film structure in which a lower conductor layer and an upper conductor layer separated by a multilayered insulator film are connected to each other through a contact hole provided in the multilayered insulator film so that the lower conductor layer and upper conductor layer are satisfactorily connected to each other.

A further object of the present invention is to improve a method of manufacturing a semiconductor device having a multi-layer film structure, in which a lower conductor layer and an upper conductor layer separated by a multilayered insulator film are connected to each other through a contact hole provided in the multilayered insulator film so that the lower conductor layer and upper conductor layer are satisfactorily connected to each other.

A still further object of the present invention is to improve the step of removing a native oxide film existing at the bottom of a contact hole provided in a multi-layered film so that neither an eaves-like protrusion nor a hollowed groove is produced on a sidewall of the contact hole.

A still further object of the present invention is to improve a method of manufacturing a semiconductor device having a multi-layer film structure so that a substrate is less damaged upon the formation of a contact hole.

A semiconductor device according to the present invention is related to a semiconductor device of a multi-layer film structure, in which a lower conductor layer and an upper conductor layer separated by a multilayered insulator film are connected to each other through a contact hole provided in the multilayered insulator film. This semiconductor device includes a substrate and a lower conductor layer provided on the substrate and having a connection portion. A first insulator film is provided on the lower conductor layer. On the first insulator film is provided a second insulator film having different etching speed from the first insulator film. A third insulator film is provided on the second insulator film. A first opening portion having a larger diameter than that of the connection portion is provided in the second insulator film above the connection portion. A second opening portion is formed penetrating the first and third insulator films to reach the connection portion. The semiconductor device further includes an upper conductor layer provided on the substrate and electrically connected to the lower conductor layer so as to line the second opening portion and cover the third insulator film.

In accordance with the semiconductor device of multi-layer film structure according to the present invention, since a sidewall of the contact hole is smoothly formed, the upper conductor layer and lower conductor layer are connected satisfactorily.

A method according to another aspect of the present invention is related to a method of manufacturing a semiconductor device of a multi-layer film structure, in which a lower conductor layer and an upper conductor layer separated by a multilayered insulator film are connected to each other through a contact hole provided in the multilayered insulator film. First, the lower conductor layer having a connection portion is formed on a semiconductor substrate. A first insulator film is then formed on the semiconductor substrate including the lower conductor layer. On the first insulator film is formed a second insulator film having different etching speed form the first insulator film. A first opening portion having a larger diameter than that of the connection portion is formed at a portion of the second insulator film which is above the connection portion. A third insulator film is formed on the second insulator film to line the first opening portion. A second opening portion for exposing the connection portion is formed in the first and third insulator films. An native oxide film existing at the surface of the exposed connection portion is removed. The upper conductor layer is deposited on the third insulator film to line the second opening portion.

In accordance with the method according to another aspect of the present invention, when a processing is provided for etching away the native oxide film existing at the surface of the exposed connection portion, i.e., at the bottom of the second opening portion, the sidewall of the contact hole recedes more or less, but an end portion of the second insulator film, defining the first opening portion, is not exposed on the sidewall of the contact hole. Therefore, neither a protrusion nor a groove is produced on the sidewall of the contact hole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiments of the present invention will now be described with reference to the figures.

Figure 1:
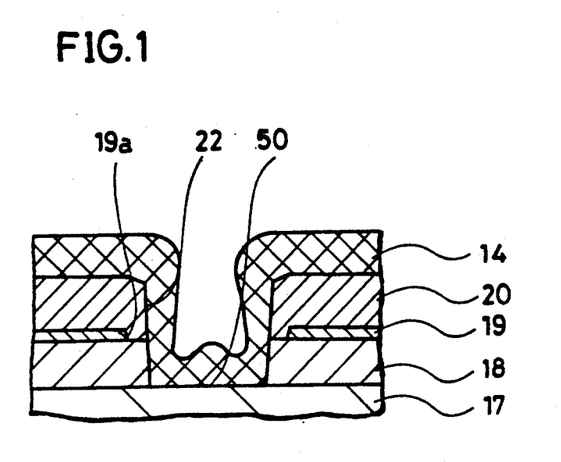
FIG. 1 is a cross sectional view of a contact portion in a semiconductor device of a multi-layer film structure according to one embodiment of the present invention.

Referring to FIG. 1, an underlying film 18 is provided on a substrate 17 (a lower conductor layer) having a connection portion. The substrate 17 is, for example, a silicon substrate or an interconnection (polycrystalline silicon, an Al alloy, etc.). The underlying film 18 is, for example, an interlayer insulation film such as a silicon oxide film.

An intermediate film 19 is provided on the underlying film 18. The intermediate film 19 is, for example, a silicon nitride film. A silicon oxide film 20 is provided on the intermediate film 19. A first opening portion 19a having a larger diameter than that of the connection portion 50 is provided in the intermediate film 19 above the connection portion 50. A second opening portion 22 is formed in the underlying silicon oxide film 18 and overlying silicon oxide film 20 so as to penetrate these films 18 and 20 to reach the connection portion 50. This semiconductor device further comprises an Al interconnection 14 provided on the substrate 17 and electrically connected to the connection portion 50 so as to line the second opening portion 22 and cover the third insulator film 20.

FIGS. 2A-2F are cross-sectional views showing the processing steps of manufacturing the semiconductor device of a multi-layer film structure shown in FIG. 1.

Figure 2A:
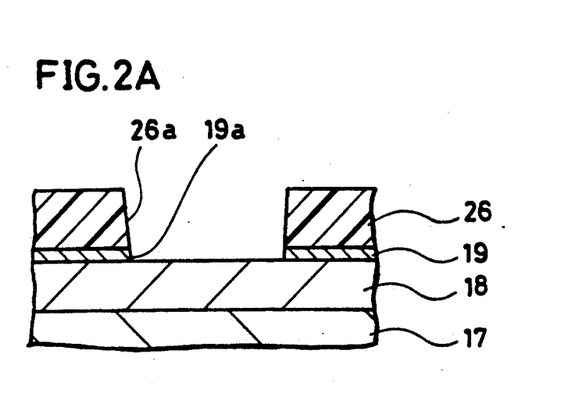
FIGS. 2A-2F are cross sectional views showing the processing steps of a method of manufacturing a semiconductor device of a multi-layer film structure having a contact hole, according to another embodiment of the present invention.

Referring to FIG. 2A, the underlying film 18 is formed on the substrate 17. The intermediate film 19 is then formed on the underlying film 18. A resist film 26 is thereafter formed on the intermediate film 19. Patterning the resist film 26 then causes an opening portion 26a having a larger diameter than that of an actual contact hole to be formed in the resist film 26. The diameter of the opening portion 26a is, for example, 3 μm. With the patterned resist film 26 used as a mask, the intermediate film 19 (silicon nitride film) is etched by plasma etching employing CF$_4$. Thus, the opening portion 19a having a larger diameter (3 μm) than that (2 μm) of the actual contact hole is formed in the intermediate film 19.

Figure 2B:
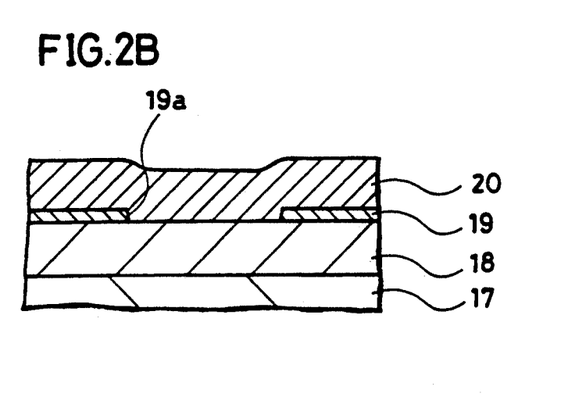

Next, with reference to FIGS. 2A and 2B, after the resist film 26 is removed, the overlying film 20 (silicon oxide film) is formed on the overall surface of the intermediate film 19 including the opening portion 19a. FIG. 2B corresponds to FIG. 1.

Figure 2C:
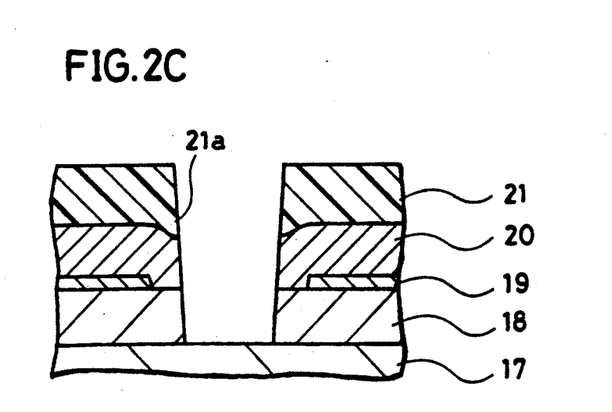

Referring to FIG. 2C, a resist film 21 is formed on the overlying film 20. The resist film 21 is thereafter patterned, thereby forming an opening portion 21a having the diameter (2 μm) of the actual contact hole in the resist film 21. With the patterned resist film 21 used as a mask, the overlying film 20 and underlying film 18 are etched at the same time by highly anisotropical plasma etching.

Figure 2D:
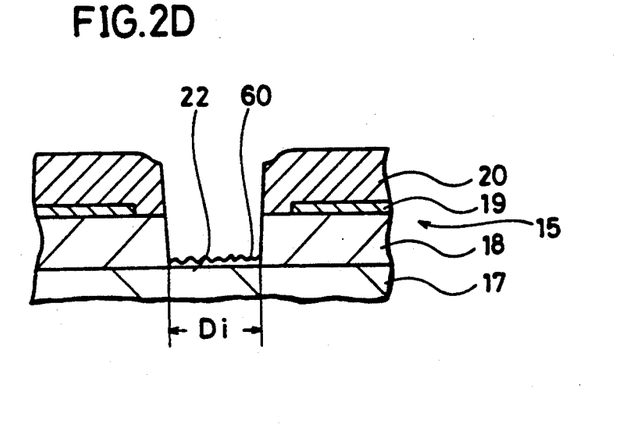

Referring to FIG. 2D, removing the resist film forms a contact hole 22 having a predetermined diameter (2 μm) in a multi-layer film 15. At this time, a native oxide film 60 is produced at the bottom of the contact hole 22.

Figure 2E:
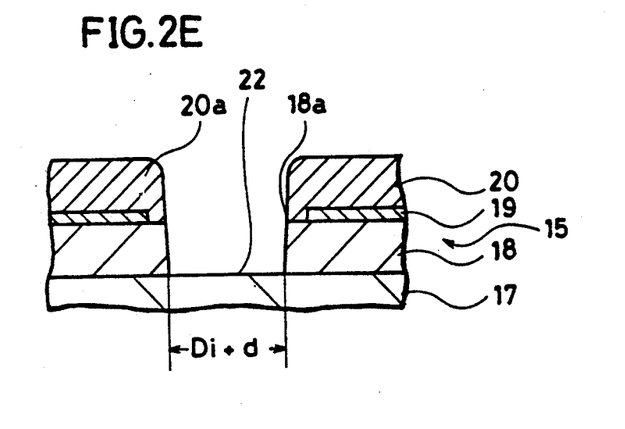

Referring to FIG. 2E, the very thin native oxide film 60 of approximate by several 10 Å in thickness, existing on the surface of the substrate 17 is then removed by dipping the substrate 17 in a dilute aqueous solution of hydrofluoric acid or ammonium fluoride for a short time. In this case, both a sidewall portion 20a of the overlying film 20 and that 18a of the underlying film 18 are more or less subjected to etching and thus recede. That is, when the diameter of the contact hole shown in FIG. 2D is Di, that of the contact hole shown in FIG. 2E is Di+4d. The intermediate film 19 is, however, receded more distantly than the sidewall portions 20a and 18a of the overlying and underlying films are, so that the intermediate film 19 is not exposed at the sidewall of the contact hole 22. Consequently, as described above, even if the native oxide film produced at the bottom of the contact hole is removed with an etchant, for example, neither a protrusion nor a hollowed groove is produced at the sidewall of the contact hole 22.

Figure 2F:
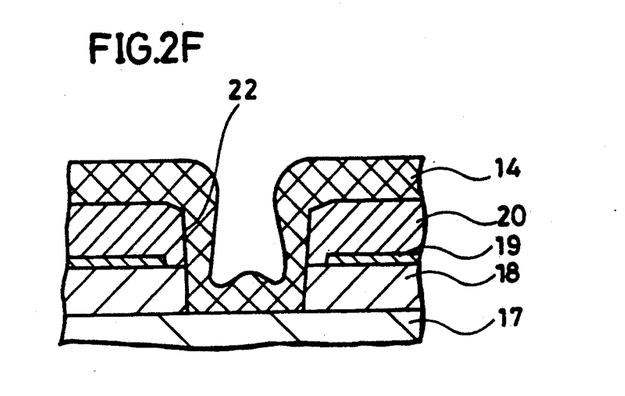

Referring to FIG. 2F, an Al-Si-Cu alloy is deposited on the overall surface of the substrate 17 including the contact hole 22 by sputtering. This deposition prevents an eaves-like protrusion or a hollowed groove from being formed at the sidewall of the contact hole 22, resulting in the formation of an Al interconnection 14 showing a good covering property on the sidewall of the contact hole 22.

In addition, while the above described embodiment shows by way of example the silicon nitride film as the intermediate film 19, the present invention is not limitative to this, and hence even the SOG film provided in the description of FIG. 8 and SiN/SiO$_2$ film achieve the same effect as that in the above embodiment.

Moreover, while the above described embodiment shows SiO$_2$/SiN/SiO$_2$ as underlying/intermediate/overlying film, multilayer (SiO$_2$/SiO$_2$/SiO$_2$) having different etching speed respectively as well as SiO$_2$/TaO$_5$/SiO$_2$ achieve the same effect as that in the above embodiment.

Figure 3:
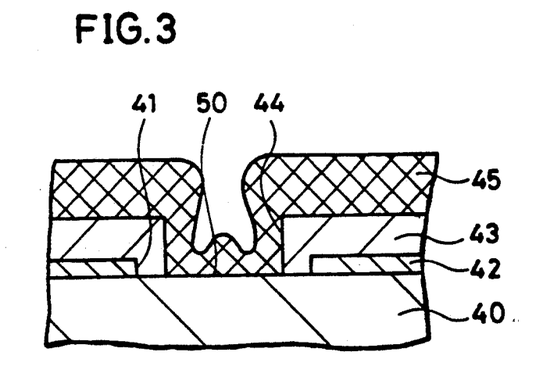
FIG. 3 is a cross sectional view of a contact portion in a semiconductor device of a multi-layer film structure according to another embodiment of the present invention.

Moreover, while the above described embodiment shows the semiconductor device of a triple-layered film structure by way of example, this invention is not limitative to this semiconductor device but may employ a semiconductor device of a double-layered film structure as shown in FIG. 3.

Referring to FIG. 3, a lower conductor layer 40 having a connection portion 50 is provided on a substrate (not shown). On the lower conductor layer 40 is provided a first insulator film (for example, a silicon nitride film) 42 having a first opening portion 41 for exposing the connection portion 50. A second insulator film (for example, a silicon oxide film) 43 is provided on the first insulator film 42. The first and second insulator films 42 and 43 have different etching speeds. A second opening portion 44 having a smaller diameter than that of the first opening portion 41 is provided in the second insulator film 43 so as to expose the first opening portion 41. An upper conductor layer 45 electrically connected to the lower conductor layer 40 is provided on the substrate including the first and second insulator films 42 and 43 so as to line the second opening portion 44. Even in the semiconductor device thus structured, the lower conductor layer 40 and upper conductor layer 45 are electrically connected in a satisfactory state.

Next, a description will be given of the structure of a semiconductor device of a double-layered film structure shown in FIG. 3.

Referring to FIG. 3, the semiconductor device according to still another embodiment of the present invention comprises a lower conductor layer 40 provided on a substrate (not shown). The lower conductor layer 40 has a connection portion 50. A first insulator film (for example, a silicon nitride film) 42 including a first opening portion 41 having a larger diameter than that of the connection portion 50 is provided on the lower conductor layer 40 so as to expose the connection portion 50. A second insulator film (for example, a silicon oxide film) 43 is provided to line the first opening portion 41 and cover the first insulator film 42. The first insulator film 42 is different from the second insulator film 43 in etching speed. In the second insulator film 43 is formed a second opening portion 44 having a smaller diameter than that of the first opening portion 41, for exposing the connection portion of the lower conductor layer 40. This semiconductor device further comprises an upper conductor layer 45 which is provided on and electrically connected to the lower conductor layer 40 so as to line the second opening portion 44 and cover the second insulator film 43. Even in the semiconductor device thus structured, the lower conductor layer 40 and upper conductor layer 45 are electrically connected in a satisfactory state.

FIGS. 10A-10D are cross-sectional views showing the steps of manufacturing the semiconductor device of the double-layered film structure shown in FIG. 3.

Figure 10A:
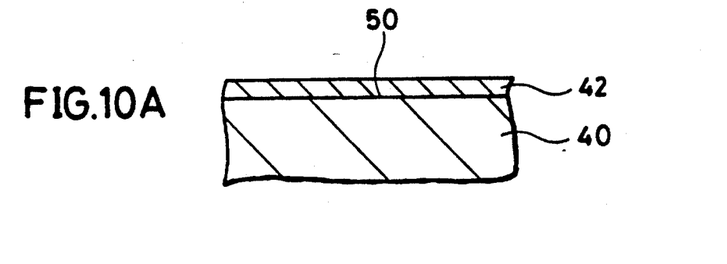
FIGS. 10A-10D are cross sectional views showing the steps of manufacturing the semiconductor device of a double-layered film structure shown in FIG. 3.
Figure 10B:
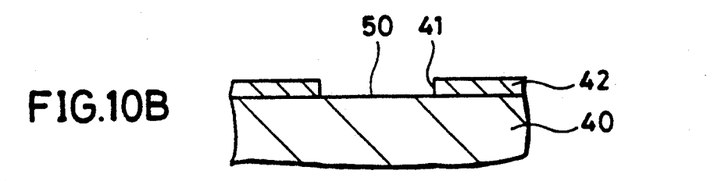
Figure 10C:
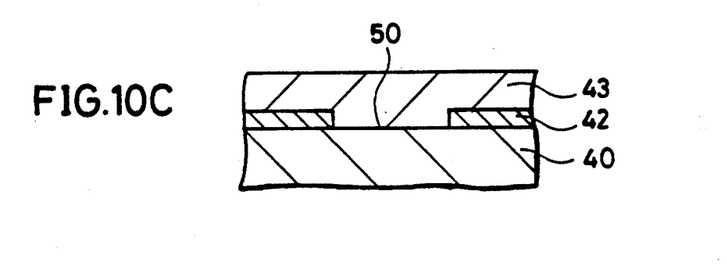

Referring to FIG. 10A, a lower conductor layer 40 having a connection portion 50 is formed on a semiconductor substrate (not shown). A first insulator film (for example, a silicon nitride film) 42 is formed on the semiconductor substrate including the lower conductor layer 40. Referring to FIG. 10B, in the first insulator film 42 is formed a first opening portion 41 having a larger diameter than that of the connection portion 50, for exposing the connection portion 50. Referring to FIG. 10C, a second insulator film (for example, a silicon oxide film) 43 is formed to line the first opening portion 41 and cover the first insulator film 42.

Figure 10D:
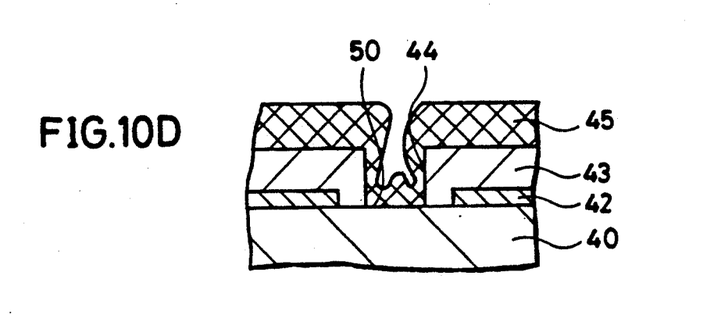

With reference to FIG. 10D, a second opening portion 44 for exposing the connection portion 50 is formed in the second insulator film 43. The semiconductor substrate is dipped in an aqueous solution of HF in order to remove a native oxide film existing on the surface of the exposed connection portion 50. At this time, the sidewall of the second opening portion 44 slightly recedes. An upper conductor layer 45 is deposited to line the second opening portion 44 and cover the second insulator film 43.

As has been described in the foregoing, the semiconductor device according to the present invention comprises the substrate, and the lower conductor layer having the connection portion, provided on the substrate. The first insulator film is provided on the lower conductor layer. On the first insulator film is formed the second insulator film having different etching speed from that of the first insulator film. The third insulator film is provided on the second insulator film. The first opening portion having a larger diameter than that of the connection portion is provided in the second insulator film above the connection portion. The second opening portion is formed penetrating the first and third insulator films to reach the connection portion. This semiconductor device further comprises the upper conductor layer provided on the substrate and electrically connected to the lower conductor layer so as to line the second opening portion and cover the third insulator film. Since the semiconductor device according to the present invention is thus structured, the sidewall of the contact hole is smooth, resulting in such an effect that the upper and lower conductor layers are connected satisfactorily.

In addition, in accordance with the method according to another aspect of the present invention, the lower conductor layer having the connection portion is first formed on the semiconductor substrate. The first insulator film is formed on the semiconductor substrate including the lower conductor layer. On the first insulator film is formed the second insulator film having different etching speed from that of the first insulator film. The first opening portion having a larger diameter than that of the connection portion is formed at a portion of the second insulator film above the connection portion. The third insulator film is formed on the second insulator film to fill the first opening portion. The second opening portion for exposing the connection portion is formed in the first and third insulator films. The native oxide film existing on the surface of the exposed connection portion is then removed. The upper conductor layer is deposited on the third insulator film so as to fill the second opening portion.

Since the method according to another aspect of the present invention is structured as above, when a processing is provided for etching away the native oxide film existing on the surface of the exposed portion, i.e., at the bottom of the second opening portion, the sidewall of the contact hole recedes more or less, but an end portion of the second insulator film, defining the first opening portion, is not exposed on the sidewall of the contact hole. Therefore, neither an protrusion nor a hollowed groove is produced at the sidewall of the contact hole. Consequently, such an effect is given that the upper and lower conductor layers are electrically connected in a satisfactory state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device of a multi-layer film structure in which a lower conductor layer and an upper conductor layer separated by a multilayered insulator film are connected to each other through a contact hole provided in the multilayered insulator film, comprising:
   a substrate;
   a lower conductor layer provided on said substrate and having a connection portion;
   a first insulator film provided on said lower conductor layer;
   a second insulator film provided on said first insulator film and having etching speed different from etching speed of said first insulator film;
   a third insulator film provided on said second insulator film;
   said second insulator film including a first opening portion having a larger diameter than a diameter of said connection portion and completely lined by said third insulator film so as not to expose the second insulator film;
   said first and third insulator film including a second opening portion penetrating said first and third insulator films to reach said connection portion; and an upper conductor layer provided on said substrate and electrically connected to said lower conductor layer so as to line said second opening portion.

2. The semiconductor device in accordance with claim 1, wherein:

said first insulator film comprises a silicon oxide film; said second insulator film comprises a silicon nitride film; and said third insulator film comprises a silicon oxide film.

3. A semiconductor device of a multi-layer film structure in which a lower conductor layer and an upper conductor layer separated by a multilayered insulator film are connected to each other through a contact hole provided in said multiple insulator film, comprising:

a substrate;

a lower conductor layer provided on said substrate and having a connection portion;

a first insulator film provided on said lower conductor layer and including a first opening portion having a larger diameter than a diameter of said connection portion, for exposing said connection portion;

a second insulator film provided so as to line said first opening portion completely so as not to expose the first insulator film and cover said first insulator film and having etching speed different from etching speed of said first insulator film;

said second insulator film including a second opening portion having a smaller diameter than the diameter of said first opening portion, for exposing said connection portion of said lower conductor layer; and an upper conductor layer provided on said substrate and electrically connected to said lower conductor layer so as to line said second opening portion.

4. The semiconductor device in accordance with claim 3, wherein said first insulator film comprises a silicon nitride film; and said second insulator film comprises a silicon oxide film.

* * * * *